(12) United States Patent
Toyota et al.

(10) Patent No.: US 7,335,915 B2
(45) Date of Patent: Feb. 26, 2008

(54) IMAGE DISPLAYING DEVICE AND METHOD FOR MANUFACTURING SAME

(75) Inventors: Yoshiaki Toyota, Hachioji (JP); Mutsuko Hatano, Kokubunji (JP)

(73) Assignee: Hitachi Displays, Ltd., Chiba (JP)

( * ) Notice: Subject to any disclaimer, the term of this patent is extended or adjusted under 35 U.S.C. 154(b) by 0 days.

(21) Appl. No.: 11/585,967

(22) Filed: Oct. 25, 2006

(65) Prior Publication Data

US 2007/0096209 A1    May 3, 2007

(30) Foreign Application Priority Data

Oct. 28, 2005   (JP)  ............... 2005-313692

(51) Int. Cl.
*H01L 29/04*   (2006.01)
(52) U.S. Cl. .......................... 257/59; 257/72
(58) Field of Classification Search .......... 257/59, 257/66, 72, 290, 291, 347, 349, 350
See application file for complete search history.

(56) References Cited

U.S. PATENT DOCUMENTS

| | | | |
|---|---|---|---|
| 6,208,011 B1 * | 3/2001 | Yasuda ...................... | 257/551 |
| 6,586,805 B2 * | 7/2003 | Yaegashi et al. ........... | 257/392 |
| 6,713,347 B2 * | 3/2004 | Cappelletti et al. ........ | 257/395 |
| 7,195,976 B2 * | 3/2007 | Adachi et al. .............. | 438/258 |

FOREIGN PATENT DOCUMENTS

JP       11-26763       7/1997

OTHER PUBLICATIONS

Ibaraki, N. "Invented Paper: Low-Temperature Poly-Si TFT Technology", SID 99 Digest, 15.1, 1999, pp. 172-175.

* cited by examiner

*Primary Examiner*—Kevin M. Picardat
(74) *Attorney, Agent, or Firm*—Reed Smith LLP; Stanley P. Fisher, Esq.; Juan Carlos A. Marquez, Esq.

(57) ABSTRACT

A technique for improving the manufacturing yield of an image displaying device is disclosed. A fabrication method of the image displaying device includes the steps of forming on an insulative substrate a plurality of island-like semiconductor layers, forming a gate insulating film on the island-like semiconductor layers, defining more than one contact hole in the gate insulating film, forming a gate electrode on the gate insulator film for causing the island-like semiconductor layer to be in contact with the gate insulator film, forming a source region, a drain region and a channel region interposed therebetween in the island-like semiconductor layer, forming an interlayer dielectric (ILD) film on the gate electrode, forming source/drain electrodes contacted with the source and drain regions and the ILD film, defining a through-hole(s) after formation of the source/drain electrodes, and removing a contact portion of the island-like semiconductor layer and gate electrode.

8 Claims, 9 Drawing Sheets

DRIVER TFT | STORAGE CAPACITOR | PIXEL TFT

IMAGE DISPLAYING DEVICE AND METHOD FOR MANUFACTURING SAME

INCORPORATION BY REFERENCE

The present application claims priority from Japanese application JP 2005-313692 filed on Oct. 28, 2005, the content of which is hereby incorporated by reference into this application.

FIELD OF THE INVENTION

The present invention relates to an image displaying device which is high in manufacturing yield, and also to a fabrication method of the image display device.

BACKGROUND OF THE INVENTION

Polycrystalline silicon Society for Information Display International Symposium Digest of Technical Papers (1999), thin-film transistors (TFTs) are higher in carrier mobility than amorphous TFTs by more than two orders of magnitude, and thus offer excellent performances. Examples utilizing this feature include an active-matrix liquid crystal display (AM-LCD) device as disclosed, for example, in p. 172. This LCD device is arranged so that peripheral drive circuitry is partly configured from poly-silicon TFTs, thereby enabling reduction in number of electrical connection nodes or terminals between a pixel part and the peripheral driver circuit. This enables it to visually display high-precision images.

Figure 2A:
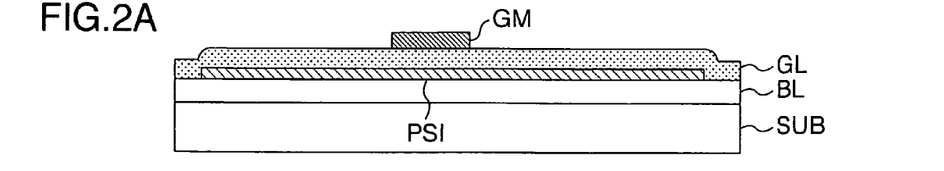
FIGS. 2A through 2E illustrate, in cross-section, some major process steps in the manufacture of a prior known poly-silicon thinfilm transistor.
Figure 2B:
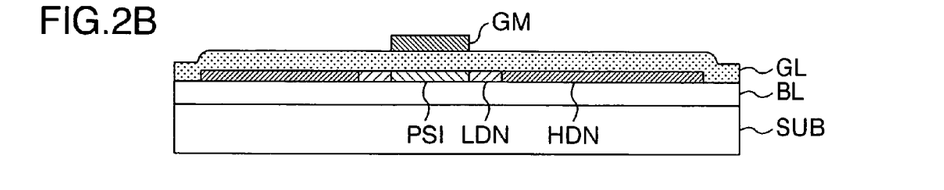
Figure 2C:
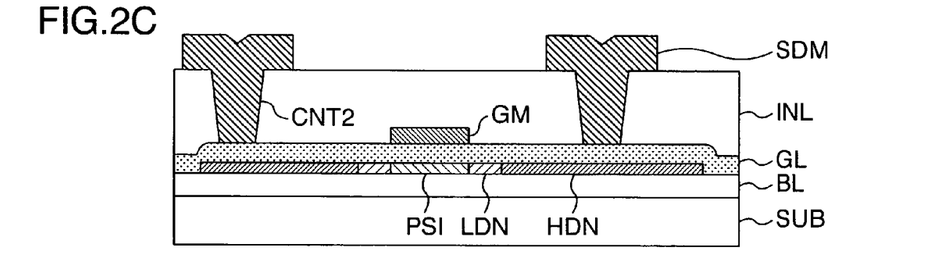
Figure 2D:
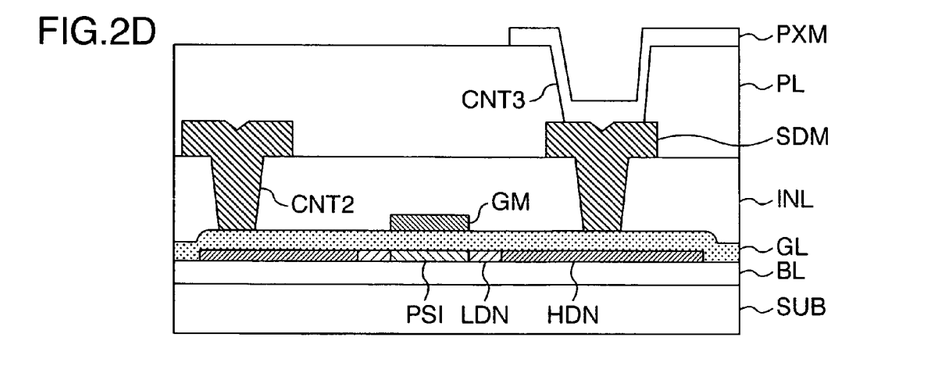

A prior known method for manufacturing a poly-silicon TFT will be described with reference to FIGS. 2A to 2E below. A silicon oxide film BL is deposited as a buffer layer on a glass substrate SUB to a thickness of about 100 nm. An amorphous silicon layer is then deposited thereon by plasma chemical vapor deposition (CVD) techniques to a thickness of 50 nm. Next, XeCl excimer laser light is irradiated for crystallization of the amorphous Si layer. Then, known photo-etching is applied, thereby obtaining an island-shaped polysilicon layer PSI. Thereafter, a gate insulating film GL is deposited by plasma CVD to a thickness of 100 nm, followed by the formation of a gate electrode GM (see FIG. 2A). Next, with the gate electrode being as a mask, a chosen kind of impurity, e.g., phosphorus (P), is implanted to form a lightly-doped n-type polysilicon layer LDN. Subsequently, with a resist as a mask, a heavily-doped n-type polysilicon layer HDN is formed (FIG. 2B). An interlayer dielectric film INL is formed by plasma CVD to entirely cover the resultant layer structure, followed by the formation of source/drain electrodes SDM through contact holes CNT2 as defined in the interlayer dielectric film (FIG. 2C). Thereafter, a passivating insulator film PL made of silicon nitride with a thickness of 500 nm is formed to cover the entirety. A pixel electrode PXM and source/drain electrode SDM is connected together via a contact hole CNT3 as defined in the passivating insulator film PL (FIG. 2D).

SUMMARY OF THE INVENTION

Prior art poly-silicon TFTs can experience occurrence of a high voltage between a polysilicon layer and gate electrode due to the accumulation of charge carriers at electrodes during ion implantation and various kinds of plasma processes. Such high voltage generation would result in destruction or breakdown of gate insulating films, thereby raising a problem of decreases in manufacturing yields. This problem becomes noticeable with a decrease in gate insulation film thickness due to the scaling of TFTs for achievement of higher performance and lower power consumption of an image display device.

Methodology of preventing such electrostatic breakdown of gate insulation films includes an approach to forming a protective diode or diodes. However, the formation of such diodes requires ion implantation. It is hardly possible to preclude the gate insulator film electrostatic breakdown occurring due to this ion implantation.

In LSI fabrication processes using a bulk silicon substrate, in order to prevent electrostatic breakdown of a gate insulating film under manufacture, a diode is formed on a silicon substrate in a way as described in JP-A-11-26763, for example. By connecting the diode to a gate electrode, charge carriers that are accumulated at the gate electrode are released or "discharged" to the substrate through the diode. However, a glass substrate is used in the manufacture of an image display device, so this method is not employable.

It is an object of the present invention to provide a technique for preventing electrostatic breakdown of a gate insulating film during manufacturing processes and for improving the production yield of an image display device by thinning gate insulation films of thin-film transistors (TFTs).

A first image display device fabrication method of this invention includes the steps of forming on an insulative substrate a plurality of island-like semiconductor layers each having a source region, a drain region, and a channel region interposed therebetween, forming a gate insulating film layer on the island-like semiconductor layers, defining more than one contact hole in the gate insulating film layer, forming a gate electrode layer on the gate insulating film layer for causing the island-like semiconductor layer to be in contact with the gate electrode layer, forming in each island-like semiconductor layer a source region, a drain region and a channel region as interposed therebetween, forming an interlayer dielectric film layer on or above the gate electrode layer, forming a source/drain electrode layer as contacted with the source region, the drain region and the interlayer dielectric film layer, and defining more than one through-hole after having formed the source/drain electrode layer, thereby to electrically cut a contact portion of the island-like semiconductor layer and the gate electrode layer.

A second image display device fabrication method of the invention includes the steps of forming on an insulative substrate a plurality of island-like semiconductor layers, forming a gate insulating film layer on the island-like semiconductor layers, defining more than one contact hole in the gate insulating film layer, forming a gate electrode layer on the gate insulating film layer for causing the island-like semiconductor layer to be in contact with the gate electrode layer, forming a source region, a drain region and a channel region as laterally interposed therebetween in each island-like semiconductor layer, forming an interlayer dielectric film layer on or above the gate electrode layer, forming a source/drain electrode layer for contact with the source region, the drain region and the interlayer dielectric film layer, forming a passivating insulating film layer to overlie the source/drain electrode layer, forming a pixel electrode layer in contact with the source/drain electrode layer and the passivating insulating film layer, and defining more than one through-hole after having formed the pixel electrode layer to thereby electrically cut a contact portion of the island-like semiconductor layer and the gate electrode layer.

The image display device of this invention is capable of preventing electrostatic breakdown of the gate insulating film layer during manufacturing processes by connecting together the semiconductor layer and the gate electrode layer to thereby force these layers to stay at substantially the same voltage potential. In fabrication processes of those devices using a bulk silicon substrate such as LSIs also, it is considered that the electrostatic breakdown of gate insulation film layer is preventable by causing the gate electrode layer to come into contact with a silicon substrate. However, because of the fact that the gate insulator film layer is less in thickness to measure several nanometers (nm), it poses a problem that the gate insulator film layer can be contaminated during its patterning processes (e.g., resist deposition process or else). On the contrary, in the image display device, TFTs are relatively great in gate insulator film thickness on the order of magnitude of several tens of nm. This lessens the contamination risk of the gate insulator film layer. Thus the method of the invention is applicable thereto.

Also note that in devices using a bulk silicon substrate, it is possible to give a voltage potential from the substrate side, so it becomes possible to obtain the intended device operability of capacitive elements or the like while causing a gate electrode layer to be electrically connected to the silicon substrate. Unfortunately, in the image display device, it is impossible to give a voltage potential to the gate electrode layer from the substrate side because of the use of a glass substrate. Furthermore, a leakage current can flow from the gate into a semiconductor layer in the state that the gate electrode layer and the semiconductor layer are connected together. This makes it no longer possible to use it as a device. Consequently, a specific process is needed for electrically disconnecting or "cutting" a contact portion of the semiconductor layer and the gate electrode layer. This process is a principal feature of this invention.

The image display device of this invention is arranged so that a semiconductor layer and gate electrode are connected together to thereby force them to stay at the same voltage potential. Thus it is possible to prevent unwanted electrostatic breakdown of the gate insulating film during fabrication processes. This in turn makes it possible to improve the manufacturing yield of the image display device.

DETAILED DESCRIPTION OF THE INVENTION

Embodiment 1

Figure 1:
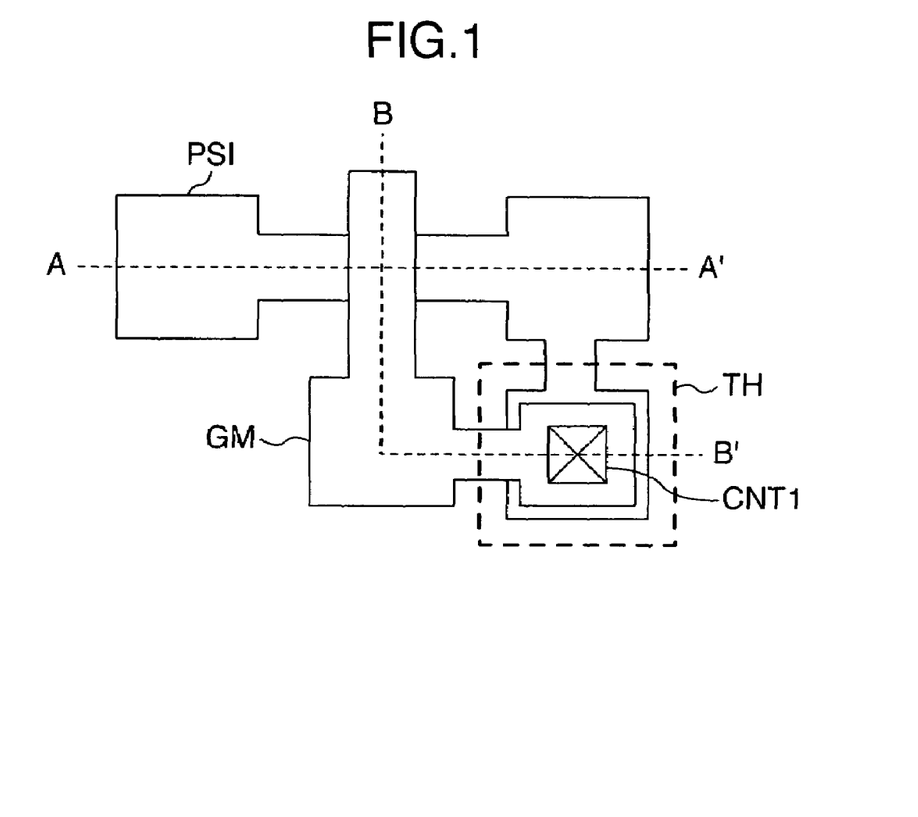
FIG. 1 is a diagram showing a plan view of a thin-film transistor of an embodiment 1.

FIG. 1 is a plan view of a thin-film transistor (TFT) after the formation of a gate electrode in a first embodiment. As shown herein, the TFT has a polycrystalline silicon or "poly-silicon" film PSI, a gate electrode GM, and a contact hole CNT1 which is defined in a gate insulating film. A region indicated by dotted line is a contact portion between the polysilicon film PSI and gate electrode GM, which is a through-hole area TH to be later removed away. A cross-section along line A-A' of the TFT after having formed a pixel electrode PXM is similar to that shown in FIG. 2D. A manufacturing method of the TFT in the first embodiment will be described using a cross-sectional structure as taken along line B-B' while referring to FIGS. 3A to 3D.

Figure 2E:
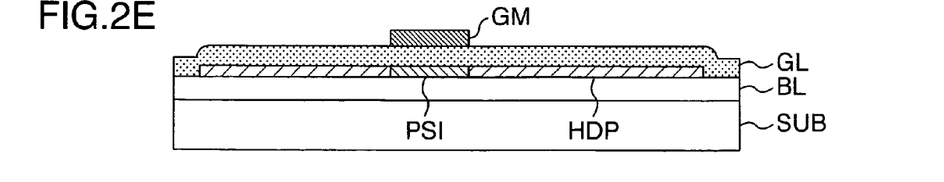
Figure 3A:
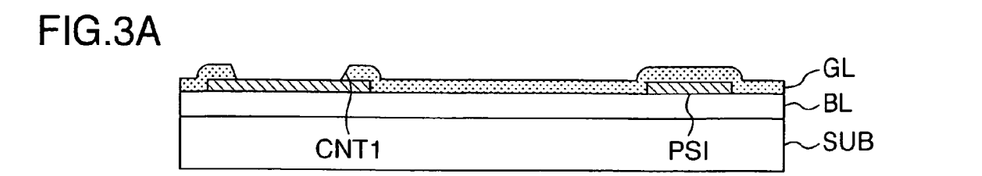
FIGS. 3A to 3D illustrate in cross-section some major process steps of a fabrication method of the embodiment 1.
Figure 3B:
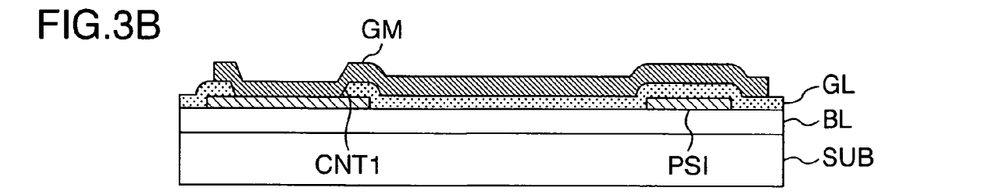
Figure 3C:
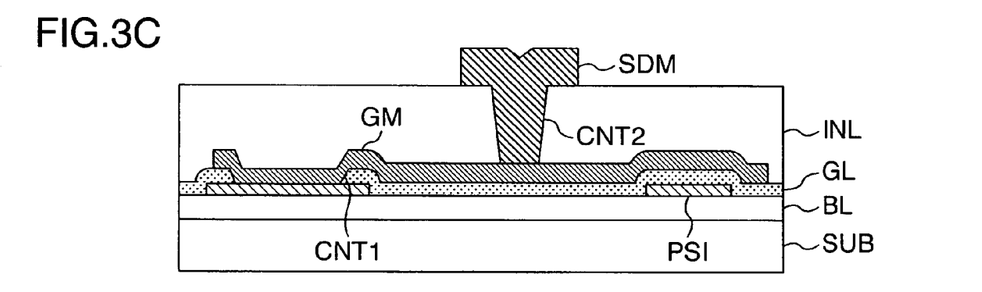
Figure 3D:
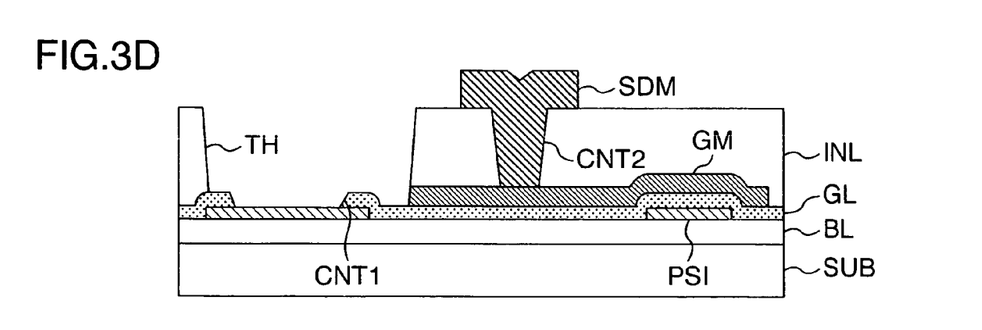

On a glass substrate SUB, a buffer layer BL made of silicon oxide is deposited by chemical vapor deposition (CVD) method to a predetermined thickness of about 100 nanometers (nm). Further, an amorphous silicon layer is deposited by plasma CVD method to a thickness of 50 nm. Next, a beam of XeCl excimer laser is irradiated for crystallization of the amorphous silicon layer; then, a known photo-etching process is used to form an island-like polysilicon layer PSI. Thereafter, a gate insulating film GL made of silicon oxide film is deposited by plasma CVD to a thickness of 50 nm. The gate insulator film GL is patterned by known photoetching process to thereby define more than one contact hole CNT (FIG. 3A). Subsequently, a gate electrode GM made of aluminum (Al) is deposited by sputtering to a thickness of 250 nm, and is patterned by known photoetching method (FIG. 3B). A plan view in this state is that of FIG. 1. After having formed the gate electrode GM, an n-conductivity channel TFT is formed by a process having the steps of doping or implanting ions with the gate electrode GM being as a mask to thereby form a lightly-doped n-type polysilicon layer LDN, and forming a heavily-doped n-type polysilicon layer HDN with a resist as a mask. Thereafter, as shown in FIG. 2E, in order to constitute a complementary metal oxide semiconductor (CMOS) part, a p-channel TFT is formed in a way such that ion implantation is performed with the gate electrode GM as a mask to thereby form a heavily-doped p-type polysilicon layer HDP. Note that FIG. 2E is an A-A' cross-sectional diagram of the structure of FIG. 1. An interlayer dielectric film INL made of silicon oxide is deposited by plasma CVD to a thickness of 500 nm. Then, known photoetching process is used to pattern the interlayer dielectric film INL, thereby defining therein a contact hole CNT2. Thereafter, a source/drain electrode SDM of a five-layer structure of Ti—TiW—Al—TiW—Ti are formed by sputtering, which electrode is then patterned by dry etch techniques (FIG. 3C). Note here that the lowermost Ti layer serves to reduce the electrical contact resistance between the heavily-doped n-type polysilicon layer HDN and Al while at the same time preventing unwanted diffusion of Al to the heavily-doped n-type polysilicon layer. Additionally the uppermost Ti layer is expected to reduce the contact resistance between Al and pixel electrode PXM. By known photoetching, more than one through-going hole TH is defined, thereby cutting electrical connection between the polysilicon layer PSI and gate electrode GM (FIG. 3D). Thereafter, a passivating insulating film PL with a thickness of 500 nm, which is made of silicon nitride, is formed to cover the entire structure while causing the pixel electrode PXM and the source/drain electrode SDM to be connected together via a contact hole CNT3 as provided in the passivating insulator film PL.

According to the illustrative embodiment, it is possible, by connecting together the polysilicon layer PSI and the gate electrode GM to force these two layers to stay at the same voltage potential, to prevent electrostatic breakdown of the gate insulating film during fabrication processes such as the dry etching process. Accordingly, it is possible to improve production yields while enabling further thickness reduction or "thinning" of the gate insulation film. This makes it possible to permit the TFT to offer enhanced performance and operability at low voltages.

Embodiment 2

Figure 4:
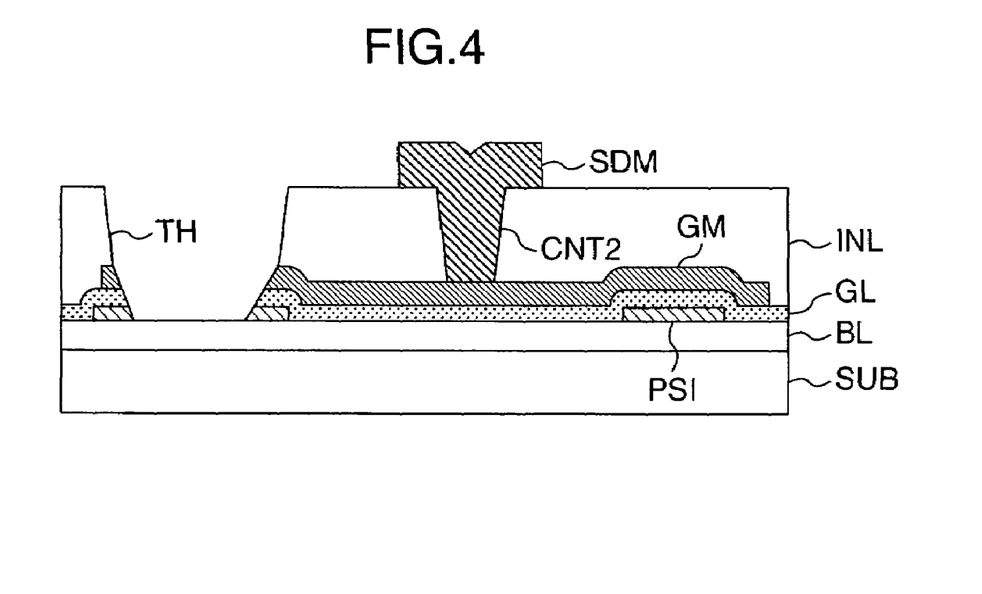
FIG. 4 is a cross-sectional diagram of a thinfilm transistor of an embodiment 2.

FIG. 4 shows a cross-sectional structure as taken along line B-B' of FIG. 1 in an embodiment 2 of this invention, which is after the formation of a through-hole TH. More specifically, this is a TFT structure wherein both the gate insulating film GL and the polysilicon layer PSI are removed away at a time during the through-hole TH formation in the embodiment 1. According to this embodiment, it is possible to reduce parasitic capacitance components as formed by the polysilicon layer PSI, thereby enabling achievement of higher performances, such as high-speed operability of circuitry.

Embodiment 3

A plan view of a TFT after gate electrode formation in an embodiment 3 of this invention is similar to that shown in FIG. 1, while an A-A' cross-section of the TFT after the formation of pixel electrode PXM is similar to that of FIG. 2D. A fabrication method of the TFT in the third embodiment will be described using a B-B' cross-sectional structure with reference to FIGS. 5A-5D.

Figure 5A:
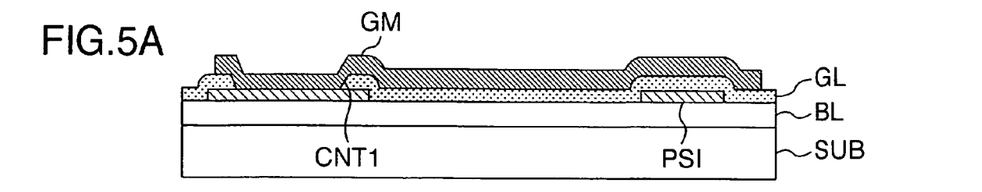
FIGS. 5A-5D show major process steps of a fabrication method of an embodiment 3.
Figure 5B:
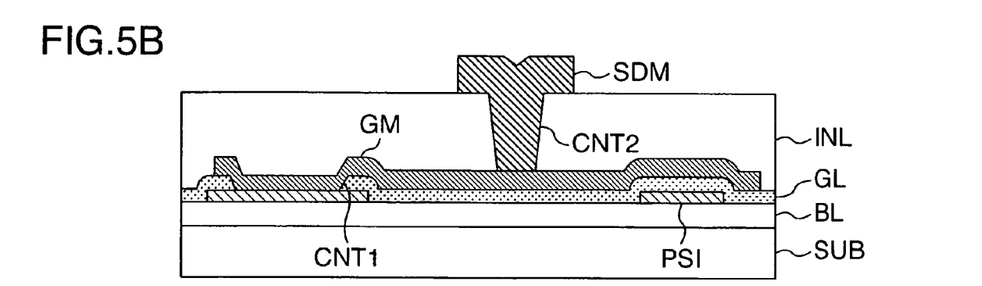
Figure 5C:
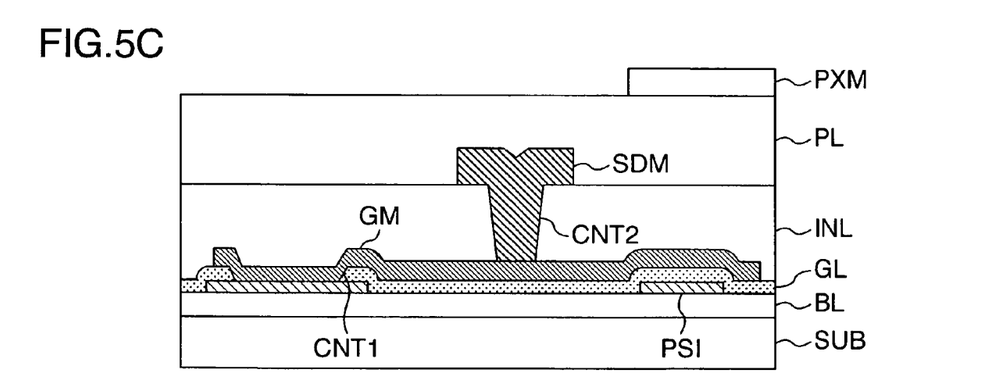
Figure 5D:
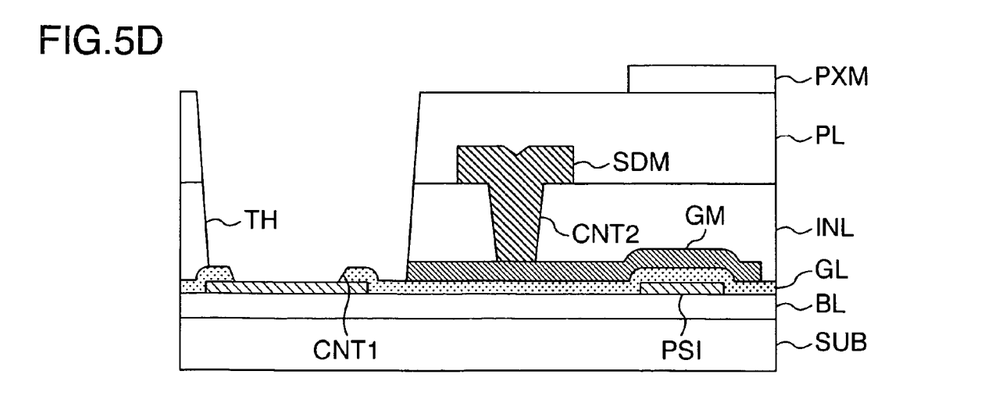

Firstly in a similar way to the embodiment 1, a buffer layer BL and island-like polysilicon layer PSI plus gate insulating film GL are formed on or above a glass substrate SUB. Then, known photoetching is done to define a contact hole CNT1 in the gate insulator film GL; then, a gate electrode GM made of Al is formed by sputtering to a thickness of 250 nm (FIG. 5A). A plan view in this state is that shown in FIG. 1. Further, as in the embodiment 1, ion implantation is carried out to form a lightly-doped n-type polysilicon layer LDN, heavily-doped n-type polysilicon layer HDN, and heavily-doped p-type polysilicon layer HDP. Then, an interlayer dielectric film INL made of silicon oxide is deposited by plasma CVD to a thickness of 500 nm. This film INL is patterned by known photoetching, thereby defining therein a contact hole CNT2. Thereafter, a source/drain electrode SDM with a five-layer structure of Ti—TiW—Al—TiW—Ti is formed by sputtering, which is then patterned by dry etch techniques (FIG. 5B). Thereafter, a passivating insulating film PL made of silicon nitride with a thickness of 500 nm is formed. After having formed the contact hole CNT3 shown in FIG. 2D, a pixel electrode PXM is formed (FIG. 5C). By known photoetching, a through-hole TH is defined, thereby cutting electrical connection between the polysilicon layer PSI and gate electrode GM (FIG. 5D).

According to this embodiment, it is possible to preclude electrostatic breakdown of the gate insulating film during processes after the source/drain electrode formation, such as the formation of the contact hole CNT3 and pixel electrode PXM. Thus it becomes possible to further improve the manufacturing yield.

Embodiment 4

Figure 6:
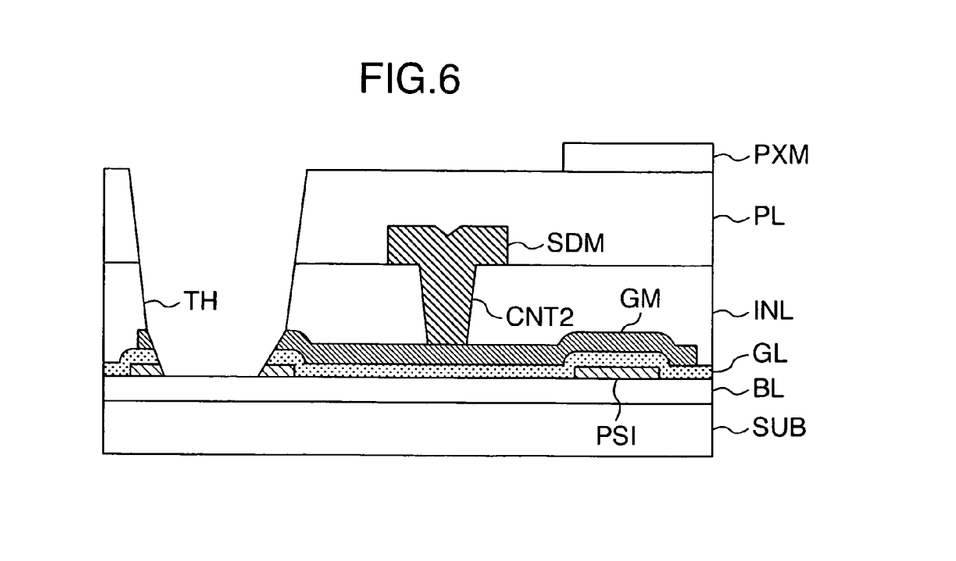
FIG. 6 depicts a cross-sectional view of a thinfilm transistor of an embodiment 4.

FIG. 6 shows a cross-section of a fourth embodiment as taken along line B-B' in FIG. 1 and shows a TFT structure obtained after the formation of through-hole TH. The structure as shown herein is the one that causes both the gate insulator film GL and the polysilicon layer PSI to be etched away at a time during the formation of the through-hole TH in the embodiment 3. According to this embodiment, it is possible to reduce parasitic capacitance components as formed by the polysilicon layer PSI, thereby enabling achievement of higher performances, such as high-speed operability of circuitry.

Embodiment 5

Figure 7:
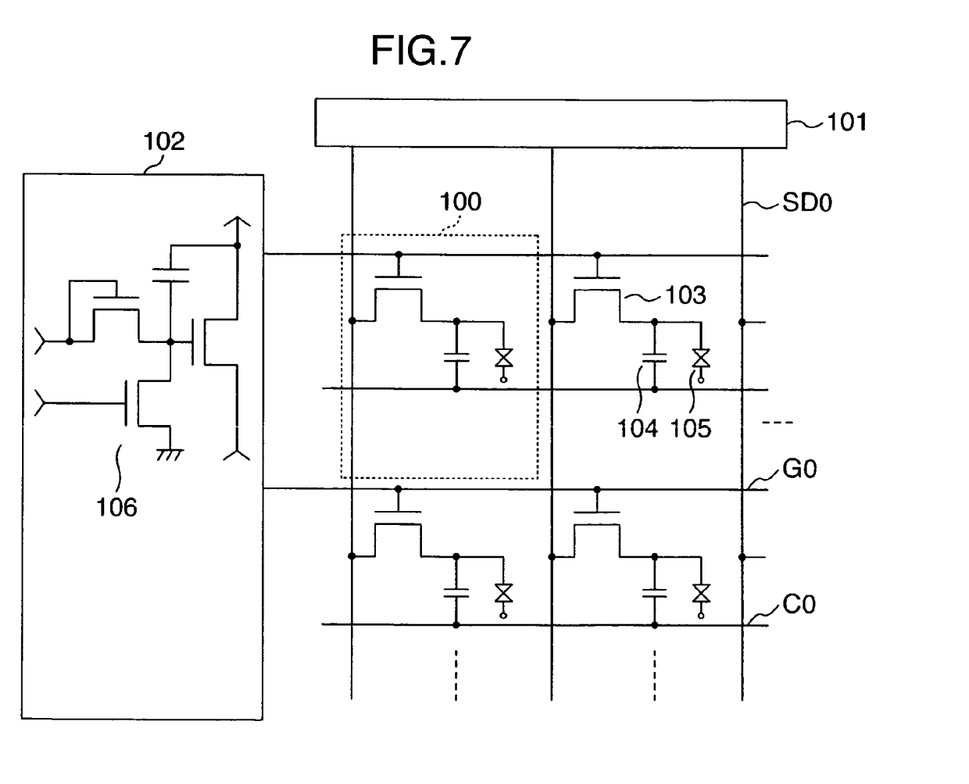
FIG. 7 shows a configuration of an image display device of an embodiment 5.
Figure 8:
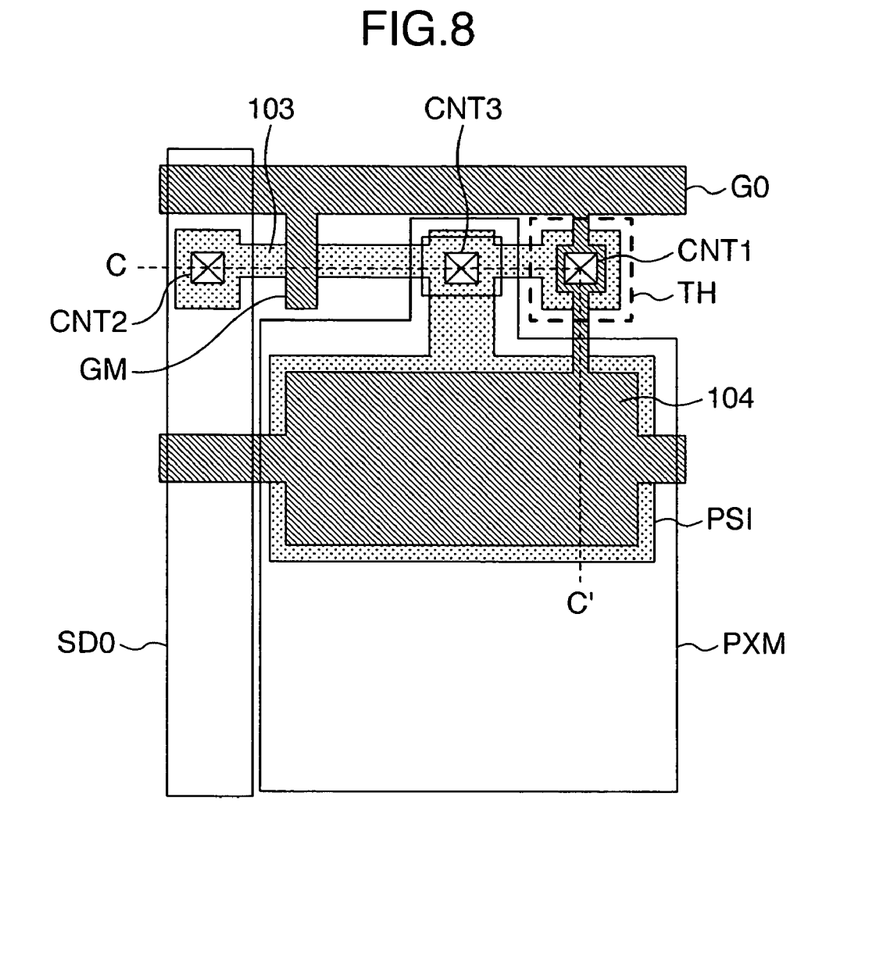
FIG. 8 is a planar layout diagram of pixels in an image display device embodying this invention.
Figure 9:
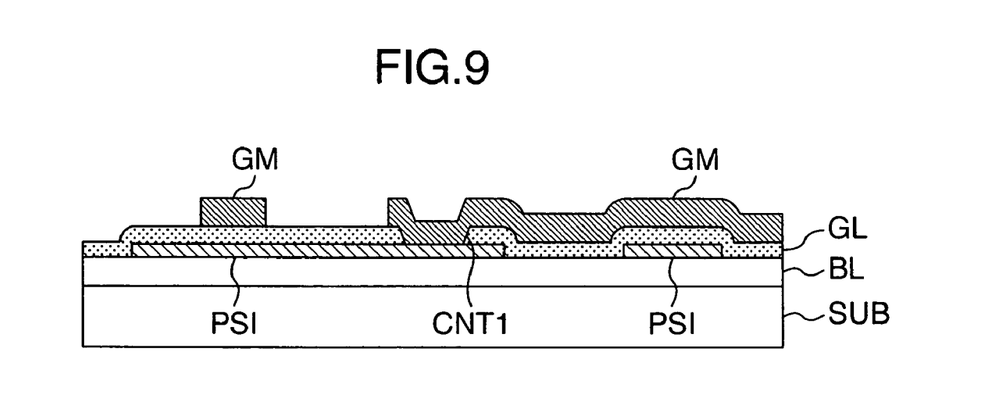
FIG. 9 is a cross-section of a pixel after the formation of a gate electrode in the embodiment 5.

FIG. 7 shows, in circuit diagram form, a configuration of an image display device in a fifth embodiment of the invention. This display device has a plurality of gate lines G0 and a plurality of signal lines SD0 which cross or "intersect" the gate lines in a matrix form. At respective intersections of the gate lines and signal lines, pixel TFTs 103 are disposed. FIG. 8 is a layout diagram of pixels 100. A through-hole region TH as indicated by dotted line is a contact portion of a polysilicon layer PSI and gate electrode GM. Although FIG. 8 is depicted in order to clarify a positional relationship with a pixel TFT 103 and storage capacitor 104, it is an area which is to be removed away during manufacturing processes. A method of removing it may be any one of the ones as stated in the embodiments 1 to 4. A cross-section along line C-C' after the gate electrode formation is shown in FIG. 9. By letting the contact portion of the polysilicon film PSI and gate electrode GM be commonly used or "shared" by the pixel TFT 103 and storage capacitor 104, it is possible to suppress an increase of the through-hole TH, which in turn makes it possible to restrain or avoid reduction of aperture ratios. Furthermore, in this embodiment, it is possible to prevent electrostatic breakdown of the gate insulator film during fabrication processes such as the dry etching process. Thus it is possible to permit the gate insulator film GL of storage capacitor 104 to further decrease in thickness. This makes it possible to lessen the area of the storage capacitor, thereby enabling improvement in aperture ratio.

Figure 10:
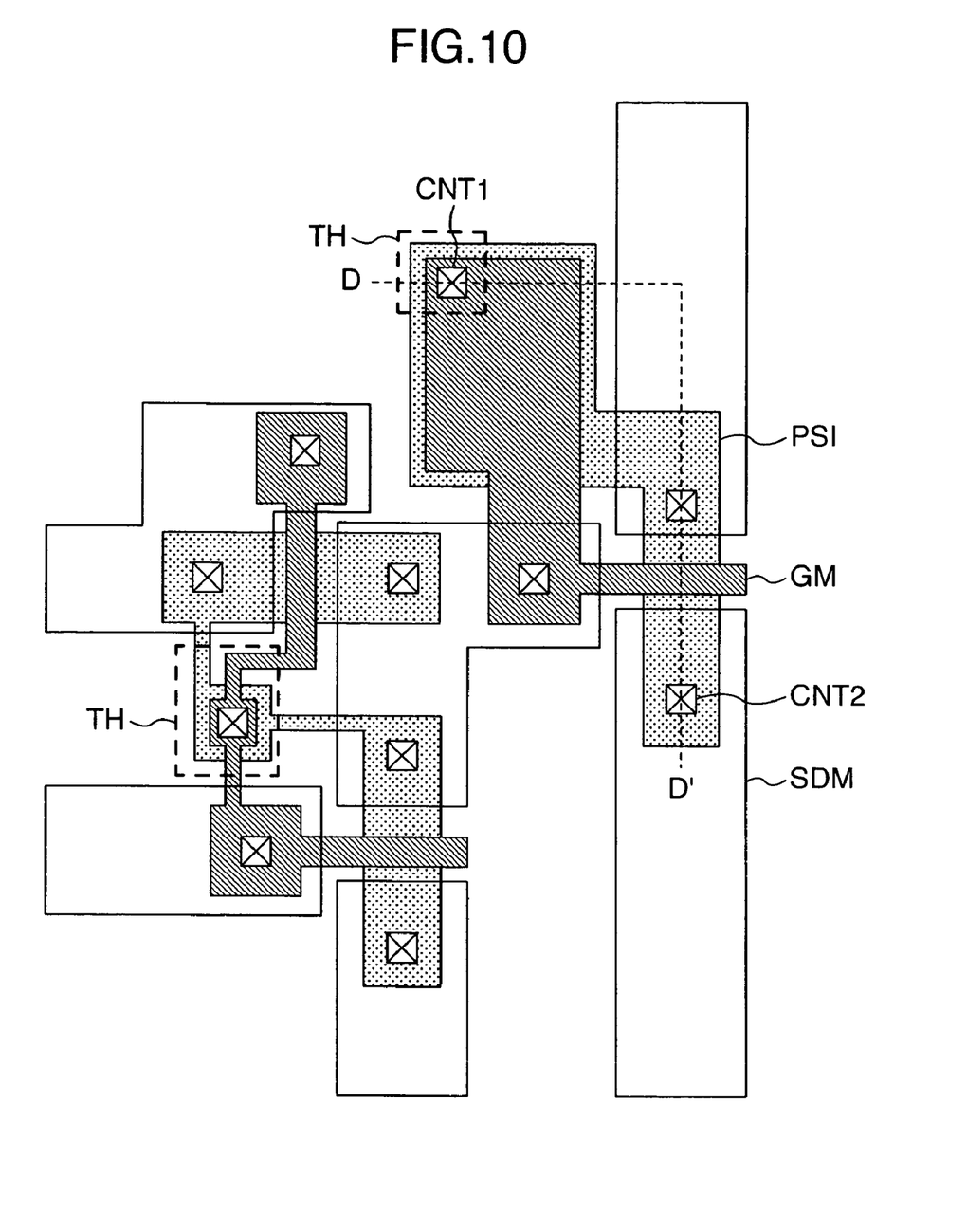
FIG. 10 shows the planar layout of a bootstrap circuit in an image display device of the embodiment 5.
Figure 11:
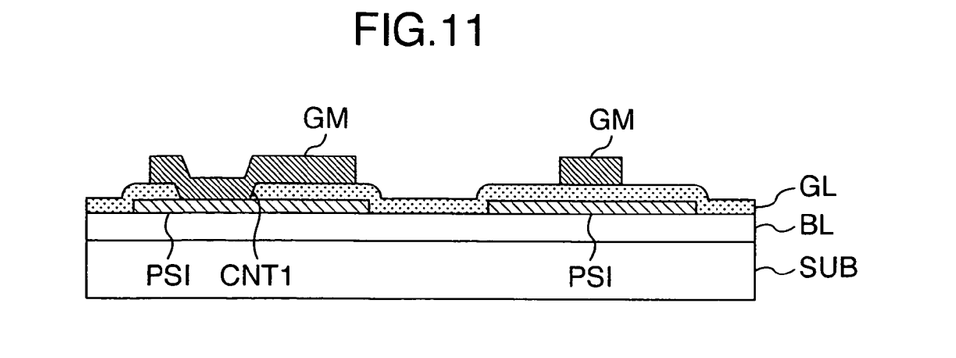
FIG. 11 is a cross-sectional view of the bootstrap circuit after gate electrode formation in the embodiment 5.

Further, as shown in FIG. 7, the image display device in this embodiment is such that a gate driver circuit 102 is made up of TFTs. Part of the gate driver circuit 102 is configured from a bootstrap circuit 106. A planar layout of the bootstrap circuit 106 is shown in FIG. 10. A respective one of through-hole regions TH indicated by dotted line is a contact portion of polysilicon film PSI and gate electrode GM, which is to be removed during manufacturing processes. A removal method thereof may be any one of those set forth in the embodiment 1 to 4. A cross-section along line D-D' after the gate electrode formation is shown in FIG. 11. The contact portion of the polysilicon film PSI and gate electrode GM is shared by more than two TFTs and capacitors whereby any increase of through-hole TH is avoidable so that it is possible to suppress decrease in integration density of circuitry. Another advantage of this embodiment lies in an ability to prevent electrostatic breakdown of the gate insulator film during manufacturing processes, such as ion implantation and dry etching. Thus it is possible to further thin the gate insulator film GL of a capacitive element(s). Accordingly, by lessening the capacitive element area, it is possible to increase the integration density of the circuitry.

According to this embodiment, it is possible by configuring part of peripheral driver circuitry from polysilicon TFTs to reduce in number electrical connection terminals between the pixel part and the peripheral drive circuit, thereby enabling achievement of high precision image displayability. Another advantage is the capability of reducing in number LSI chips required for the peripheral circuitry. This makes it possible for the image display device to decrease in production costs.

Embodiment 6

Figure 12:
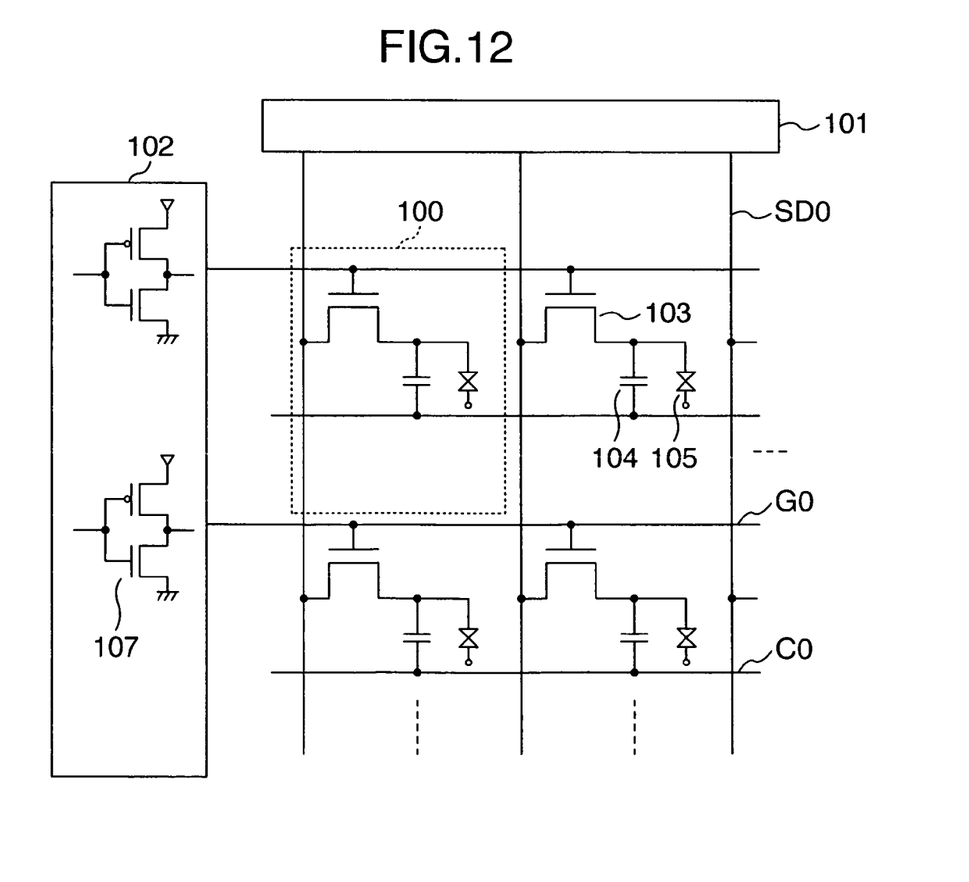
FIG. 12 shows a configuration of an image display device of an embodiment 6.
Figure 13:
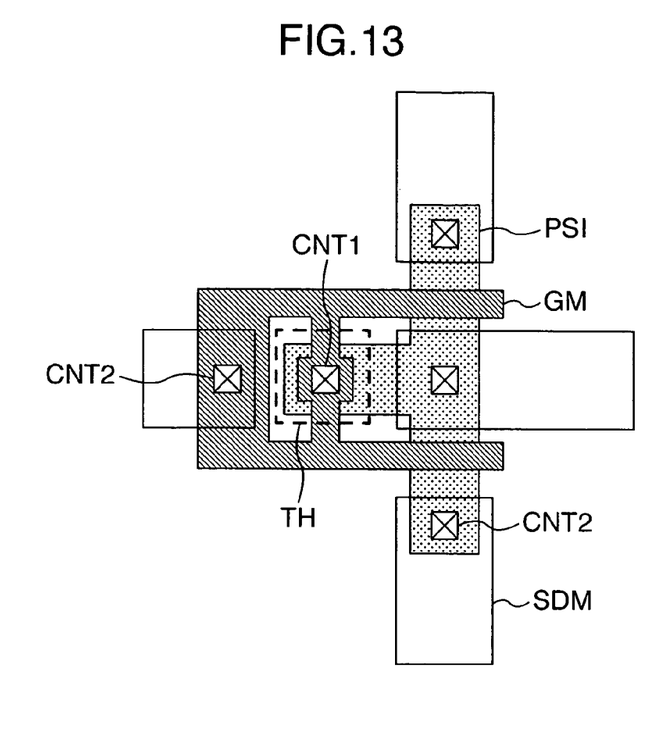
FIG. 13 is the planar layout of a CMOS part in the image display device of the embodiment 6.

A configuration of an image display device in a sixth embodiment of this invention is shown in FIG. 12. FIG. 13 is a planar layout diagram of a CMOS 107 for use in a drain driver circuit 101 and gate driver circuit 102. A through-hole region TH indicated by dotted line is a contact portion of polysilicon film PSI and gate electrode GM, which is to be removed away during manufacturing processes. A method for removal may be any one of those stated in the embodiment 1 to 4.

According to this embodiment, by letting the contact portion of the polysilicon film PSI and gate electrode GM be shared by n- and p-channel TFTs, it is possible to suppress increase of through-holes TH and also possible to avoid decrease in integration density of circuitry. Obviously, by sharing the contact portion of the polysilicon film PSI and gate electrode GM by other CMOS parts and/or capacitive elements, it is possible to effectively restrain the circuitry's integration density reduction.

Embodiment 7

Figure 14:
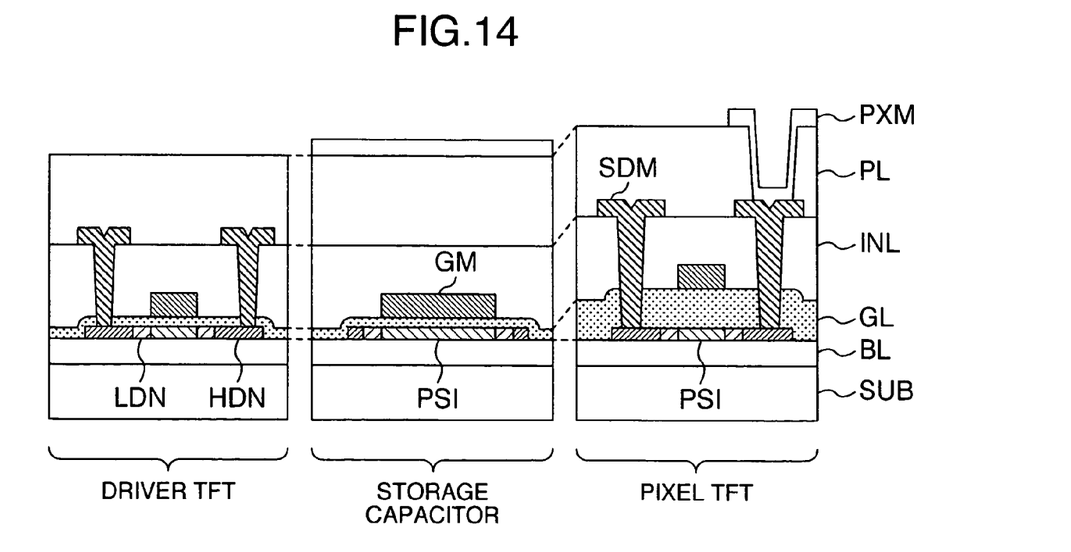
FIG. 14 depicts in cross-section a thinfilm transistor and a capacitive element of an embodiment 7.

A configuration diagram of an image display device in a seventh embodiment of the invention is similar to that shown in FIG. 7 or FIG. 12. FIG. 14 depicts, in cross-section, a pixel TFT 103, storage capacitor 104, and a TFT for constitution of drain driver 101 or gate driver 102. The pixel TFT is greater in gate insulator film thickness than the storage capacitor and the TFT making up the driver, so the gate insulator film's electrostatic breakdown hardly takes place during fabrication processes. Thus, the production yield is improved. As the storage capacitor is such that its gate insulator film is thin, the area may be reduced, thereby improving its aperture ratio. The driver TFT also is less in gate insulator film thickness, thereby enabling the TFT to operate at low voltages. This permits the image display device to offer low power consumption. A method of manufacturing these TFTs and storage capacitor may be any one of those as has been stated in the embodiments 1 to 4. Additionally, TFTs with thick gate insulator films rarely experience the electrostatic breakdown during manufacturing processes. Thus it becomes unnecessary to form the contact portion of a polysilicon film and gate electrode. In this case, it is no longer needed to provide through-hole regions. Thus it is possible to avoid or minimize decreases in aperture ratio and in integration density of on-chip circuitry.

In the image display devices as stated in the embodiments 1 to 7, the substrate SUB may be replaced with another insulative substrate made of, for example, plastic materials. Regarding the buffer layer BL, the silicon oxide film as used therefor is replaceable by either a silicon nitride film or a multilayer film structure having more than one silicon oxide film and silicon nitride film. Using the silicon nitride film as the buffer layer makes it possible to effectively preventing those impurities within the glass substrate from diffusing into and "invading" the inside of the gate insulator film. The material of the gate electrode may also be known electrode materials, such as Ti, Ta or the like. The interlayer dielectric film INL may be a silicon oxide film or a multilayer structure of silicon oxide and silicon nitride films or, alternatively, may be other known low-dielectric-constant or "low-k" materials. The gate insulator film GL may be made of known high-dielectric-constant or "high-k" material, such as $Al_2O_3$, $Y_2O_3$, $La_2O_3$, $Ta_2O_5$, $ZrO_2$, $LaAlO_3$, $ZrTiO_4$, $HfO_2$, $SrZrO_3$, $TiO_2$, $SrTiO_3$, $SrBi_2Ta_2O_9$, $(Ba_xSr_{1-x})TiO_3$, $Pb(Zr_yTi_{1-y})O_3$ or, alternatively, may be a multilayer structure with a silicon oxide film(s). Use of such high-k material makes it possible to make the gate insulator film thicker. Thus it is possible to lessen the influenceability of contamination of the gate insulator film during the formation of the contact hole CNT1.

By connecting together a semiconductor layer and a gate electrode to thereby cause these layers to stay at the same potential level, it is possible to provide an image display device capable of improving manufacturing yields while preventing electrostatic breakdown of a gate insulating film during fabrication processes. Additionally, this invention may be applied not only to the LCD device but also to other types of active-matrix image display devices including, but not limited to, display devices using organic light-emitting diodes (LEDs).

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An image displaying device having on an insulative substrate a plurality of thin film transistors, wherein each of said thin film transistors comprises an island-like semiconductor layer with a source region, a drain region and a channel region interposed therebetween, a gate insulating film layer as formed between the island-like semiconductor layer and a gate electrode layer, and an interlayer dielectric film layer formed on or above said gate electrode layer, wherein each said thin film transistor has a through-hole, and wherein a cross-section of the through-hole has said interlayer dielectric film layer and said gate electrode layer.

2. The image displaying device according to claim 1, wherein the cross-section of said through-hole includes said interlayer dielectric film layer, said gate electrode layer, said gate insulating film layer, and said island-like semiconductor layer.

3. The image displaying device according to claim 1, further comprising a capacitive element above said substrate, wherein said capacitive element has said island-like semiconductor layer, said gate insulating film layer and said gate electrode layer and wherein said capacitive element also has a through-hole.

4. The image displaying device according to claim 3, wherein a cross-section of said through-hole is comprised of said interlayer dielectric film layer, said gate electrode layer, said gate insulating film layer, and said island-like semiconductor layer.

5. An image displaying device having on an insulative substrate a plurality of thin film transistors, wherein each of said thin film transistors comprises an island-like semiconductor layer with a source region, a drain region and a channel region interposed therebetween, a gate insulating film layer as formed between the island-like semiconductor layer and a gate electrode layer, an interlayer dielectric film layer formed on or above said gate electrode layer, and a passivating insulating film layer as formed on said interlayer dielectric film layer, wherein each said thin film transistor has a through-hole, and wherein a cross-section of the through-hole has said passivating insulating film layer, said interlayer dielectric film layer and said gate electrode layer.

6. The image displaying device according to claim 5, wherein the cross-section of said through-hole includes said passivating insulating film layer, said interlayer dielectric film layer, said gate electrode layer, said gate insulating film layer, and said island-like semiconductor layer.

7. The image displaying device according to claim 5, further comprising a capacitive element above said substrate, wherein said capacitive element has said island-like semiconductor layer, said gate insulating film layer and said gate electrode layer and wherein said capacitive element also has a through-hole.

8. The image displaying device according to claim 7, wherein a cross-section of said through-hole is comprised of said passivating insulating film layer, said interlayer dielectric film layer, said gate electrode layer, said gate insulating film layer, and said island-like semiconductor layer.

* * * * *